(12) United States Patent
Moon

(10) Patent No.: US 8,334,706 B2
(45) Date of Patent: Dec. 18, 2012

(54) IMPEDANCE CALIBRATION MODE CONTROL CIRCUIT

(75) Inventor: In-Jun Moon, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 1 day.

(21) Appl. No.: 12/975,578

(22) Filed: Dec. 22, 2010

(65) Prior Publication Data

US 2012/0007630 A1   Jan. 12, 2012

(30) Foreign Application Priority Data

Jul. 8, 2010   (KR) .................. 10-2010-0065961

(51) Int. Cl.
*H03K 17/16* (2006.01)
(52) U.S. Cl. ................. 326/30; 326/26; 326/83
(58) Field of Classification Search ........ 326/30
See application file for complete search history.

(56) References Cited

U.S. PATENT DOCUMENTS

| | | | |
|---|---|---|---|
| 2008/0001623 A1* | 1/2008 | Kim ................................ | 326/30 |
| 2008/0219068 A1* | 9/2008 | Kim et al. ...................... | 365/198 |
| 2008/0252332 A1* | 10/2008 | Lee et al. ........................ | 326/30 |
| 2009/0289658 A1* | 11/2009 | Moon ............................. | 326/30 |
| 2010/0156455 A1* | 6/2010 | Yang et al. ..................... | 326/30 |
| 2011/0074462 A1* | 3/2011 | Chung ............................ | 326/30 |

FOREIGN PATENT DOCUMENTS

KR   1020070044790   4/2007
KR   1020100073333   7/2010

* cited by examiner

*Primary Examiner* — Shawki Ismail
*Assistant Examiner* — Jany Tran
(74) *Attorney, Agent, or Firm* — IP & T Group LLP

(57) ABSTRACT

An impedance calibration mode control circuit includes: a first signal generating unit configured to generate a first calibration control signal in response to a ZQ calibration command received after a power-up operation; and a second signal generating unit configured to generate a second calibration control signal during a refresh operation of a semiconductor device.

20 Claims, 10 Drawing Sheets

FIG. 5
(PRIOR ART)

| Function | CKE | | C8# | RA8# | CA8# | WE# | BA9 ~BA0 | A15 ~A19 | A12 | A10 | A11, A9~A0 |
|---|---|---|---|---|---|---|---|---|---|---|---|
| | NEXT CYCLE | NEXT CYCLE | | | | | | | | | |
| ZQ Calibration Long(ZQCL) | H | H | L | H | H | L | X | X | X | 1 | X |
| ZQ Calibration Shot(ZQC8) | H | H | L | H | H | L | X | X | X | 0 | X |

FIG. 6
(PRIOR ART)

| Symbol | DDR3 800/1066/1333/1600 | | |
|---|---|---|---|
| | Min | Max | Units |
| tZQoper | 256 | NA | tCK |
| tZQInit | 512 | NA | tCK |
| tZQCS | 64 | NA | tCK |

IMPEDANCE CALIBRATION MODE CONTROL CIRCUIT

CROSS-REFERENCE TO RELATED APPLICATION

The present application claims priority of Korean Patent Application No. 10-2010-0065961, filed on Jul. 8, 2010, which is incorporated herein by reference in its entirety.

BACKGROUND OF THE INVENTION

Exemplary embodiments of the present invention relate to an integrated circuit (IC) design technology, and more particularly, to an impedance calibration mode control circuit for controlling a calibration operation on a resistance and an ODT (On-Die-Termination) value in response to PVT (Pressure, Voltage and Temperature) variations.

FIG. 1 is a diagram illustrating a conventional ZQ calibration control circuit.

In general, the ZQ calibration performs a pull-up calibration operation on an internal pull-up resistor coupled to an external termination resistor (RZQ) 8, and performs a pull-down calibration operation on an internal pull-down resistor coupled to an internal pull-up resistor according to the result of the pull-up calibration operation.

More specifically, as illustrated in FIG. 2, a pull-up calibration operation is performed using a PCODE<0:N> signal generated by a counter 3. When an external resistance RZQ and an internal pull-up resistance RUP become equal to each other by the pull-up calibration operation, a current IUP and a current IDN become equal to each other at a ZQ node and the potential of the ZQ node becomes ½ VDDQ.

As illustrated in FIG. 3, a pull-down calibration operation is performed using a PCODE<0:N>signal generated by a counter 3 and a NCODE<0:N>signal generated by a counter 5. The pull-down calibration operation equalizes a pull-down resistance RDN and a pull-up resistance RUP calibrated by the pull-up calibration operation. Thus, when the pull-up resistance RUP and the pull-down resistance RDN become equal to each other, a current IUP and a current IDN become equal to each other at a NCAL_DQ node and the potential of the NCAL_DQ node becomes ½ VDDQ.

In this manner, the potential of the ZQ node and the potential of the NCAL_DQ node are controlled to the target value ½ VDDQ in ZQ calibration control mode by the pull-up calibration operation control and the pull-down calibration operation control as illustrated in FIG. 4.

As illustrated in FIG. 6, the above-described ZQ calibration control mode includes: a ZQINIT mode (corresponding to tZQInit) performed first after a power up; a ZQOPER mode (corresponding to tZQOper) performed according to an input from a controller during the operation of a semiconductor device; and a ZQCS mode (corresponding to tZQCS) performed at periods of, for example, 128 ms. The ZQINIT mode and the ZQOPER mode are included in a ZQCL mode. Here, the ZQINIT mode may be performed within 512 cycles. The ZQOPER mode may be performed within 256 cycles. The ZQCS mode may be performed within 64 cycles.

As illustrated in FIGS. 5 and 7, the ZQ calibration control mode is performed according to a ZQ command generated in response to CS#, RAS#, CAS# and WE# signals. For example, the ZQCL mode is performed when an address signal A<10> is high logic level '1'; and the ZQCS mode is performed when the address signal A<10> is low logic state '0'.

As illustrated in FIG. 8, in the conventional ZQ calibration mode control, a power-up operation is performed when a ZQ command ZQC is inputted and an address signal A<10> is high logic level '1'. When the ZQ command is inputted first, a state signal INIT_STATE changes to a high state and a ZQINIT mode is performed. After the ZQINIT mode is performed, when the state signal INIT_STATE changes to a low state, the ZQ command ZQC is inputted and the address signal A<10> is high logic level '1', a ZQOPER mode is performed and an calibration control operation is performed according to a ZQCL mode.

Here, as illustrated in FIG. 7, the conventional auto ZQ calibration circuit controlling a ZQ calibration operation as described above may not accommodate command control operations other than those described above for performing the calibration operations according to the ZQCL mode and the ZQCS mode, where a high impedance state Hiz as represented by a DQ data bus is maintained.

In performing the ZQCS mode operation at periods of 128 ms according to an example, some operations may not be performed at every ZQCS mode operation. A device for ensuring performance of all control operations the ZQCS mode operation at periods of 128 ms would be useful.

SUMMARY OF THE INVENTION

An embodiment of the present invention is directed to an impedance calibration mode control circuit that enables efficient system use by controlling a ZQCS mode operation to be connected with a refresh operation.

In accordance with an embodiment of the present invention, an impedance calibration mode control circuit includes: a first signal generating unit configured to generate a first calibration control signal in response to a ZQ calibration command received after a power-up operation; and a second signal generating unit configured to generate a second calibration control signal during a refresh operation of a semiconductor device.

In accordance with another embodiment of the present invention, an impedance calibration mode control circuit includes: a first signal generating unit configured to generate a first calibration control signal in response to a first ZQ calibration command received after a power-up operation; a second signal generating unit configured to generate a second calibration control signal during a refresh operation of a semiconductor device; and a third signal generating unit configured to receive a second command and the first calibration control signal as delayed for a first period of time and generate a third calibration control signal.

In accordance with yet another embodiment of the present invention, an impedance calibration mode control circuit includes: a first signal generating unit configured to generate a first calibration control signal in response to a ZQ calibration command; a second signal generating unit configured to generate a second calibration control signal during a refresh operation of a semiconductor device; a third signal generating unit configured to receive the first calibration control signal in response to a second command received after a power-up operation, and generate a third calibration control signal; and a fourth signal generating unit configured to receive the first calibration control signal and the third calibration control signal as delayed by a first period of time and generate a fourth calibration control signal.

BRIEF DESCRIPTION OF THE DRAWINGS

FIG. 5 is a diagram illustrating a ZQ calibration command truth table.

FIG. 6 is a diagram illustrating ZQ calibration timing parameters.

DESCRIPTION OF SPECIFIC EMBODIMENTS

Figure 1:
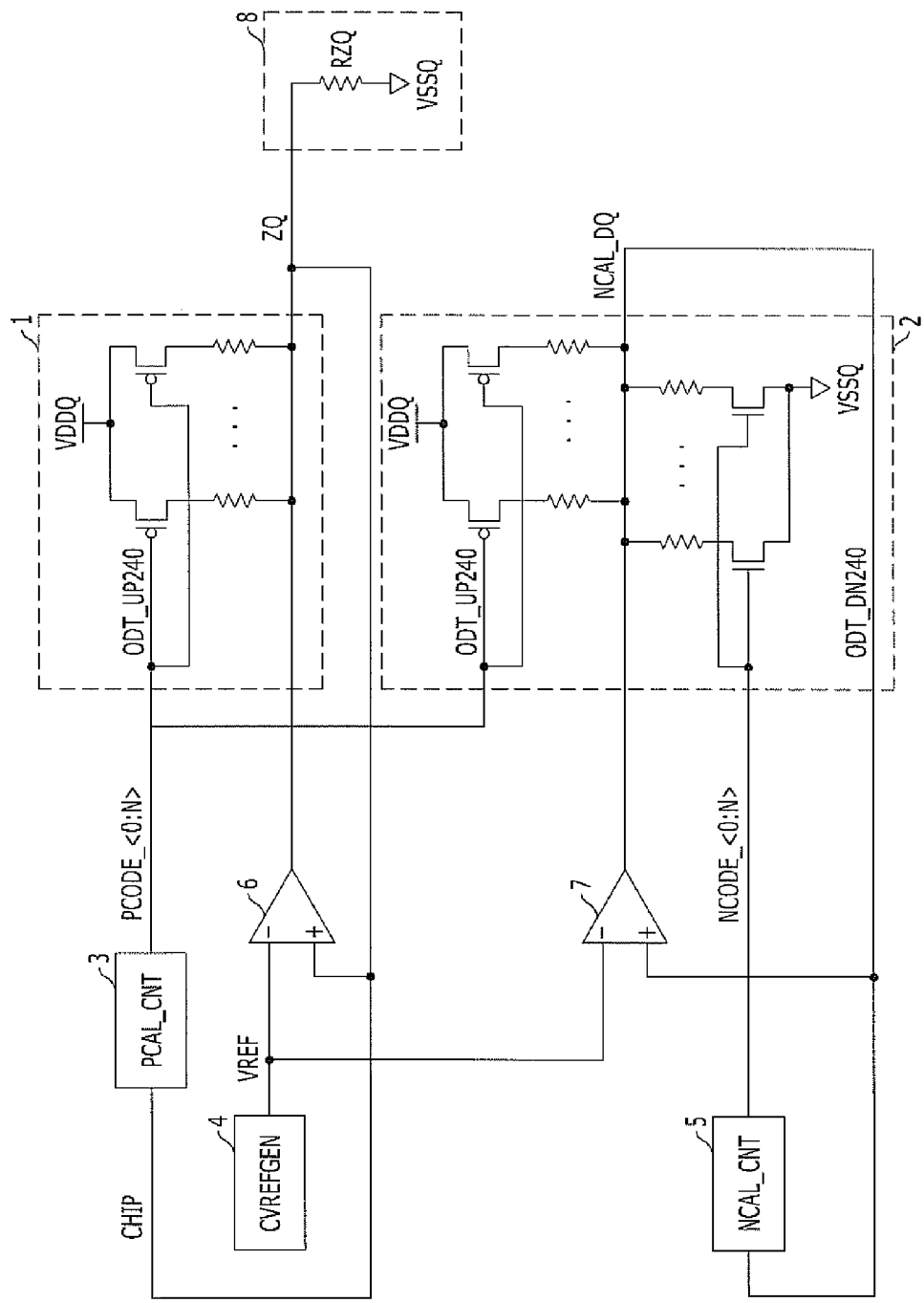
FIG. 1 is a diagram illustrating a conventional ZQ calibration control circuit.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Hereinafter, an impedance calibration mode control circuit in accordance with an exemplary embodiment of the present invention will be described in detail with reference to the accompanying drawings.

Figure 9:
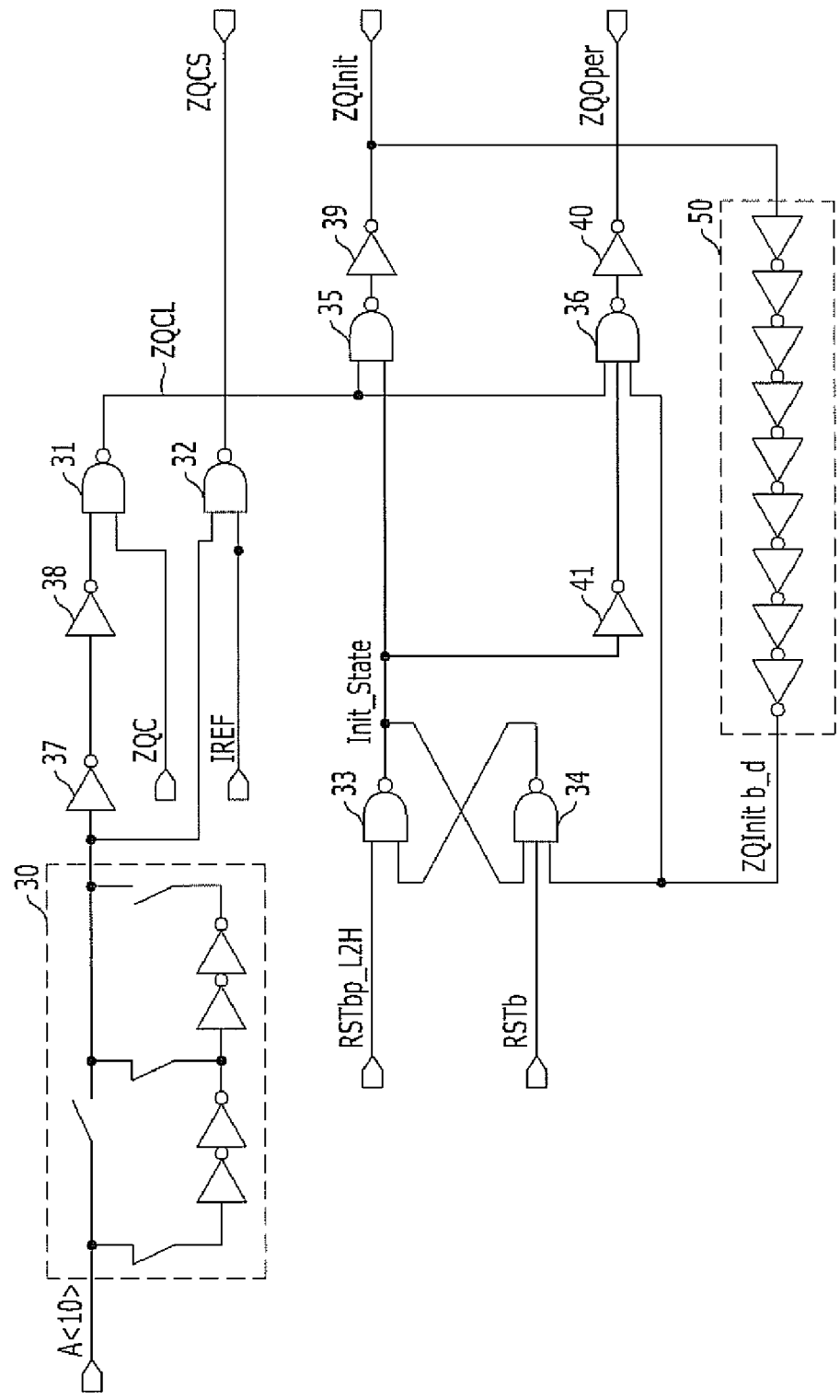
FIG. 9 is a diagram illustrating an impedance calibration mode control circuit in accordance with an exemplary embodiment of the present invention.

FIG. 9 is a diagram illustrating an impedance calibration mode control circuit for generating an auto ZQ calibration mode control signal in accordance with an exemplary embodiment of the present invention. In describing an auto ZQ calibration operation according to an exemplary embodiment of the present invention, the configuration of an auto ZQ calibration circuit will also be described with reference to FIGS. 1 to 4 as appropriate to illustrate common features.

In accordance with the present invention, the ZQ calibration control mode includes a ZQINIT mode, a ZQOPER mode and ZQCS mode.

The ZQINT mode operation is performed first after a power up. The ZQOPER mode operation is performed in response to an input from a controller during the operation of a semiconductor device. The ZQCS mode operation is performed together with a refresh operation in a refresh operation mode of a semiconductor device. The ZQINIT mode and the ZQOPER mode are parts of a ZQCL mode.

As illustrated in FIG. 1, the ZQ calibration including the above-described three modes includes performing a pull-up calibration operation on an internal pull-up resistor coupled to an external termination resistor, and performing a pull-down calibration operation on an internal pull-down resistor coupled to the internal pull-up resistor according to the result of the pull-up calibration operation.

Figure 2:
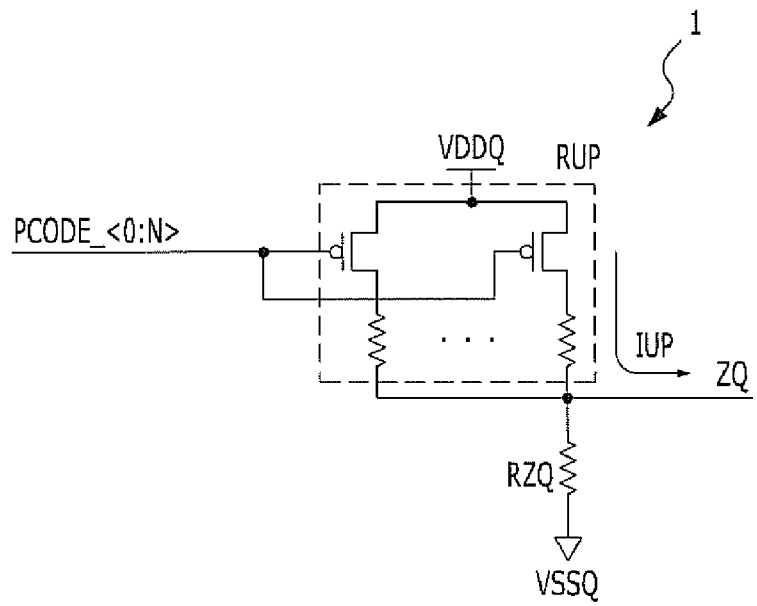
FIG. 2 is a diagram illustrating a conventional pull-up calibration control process.

More specifically, as illustrated in FIG. 2, a pull-up calibration operation is performed in response to a PCODE<0:N> signal generated by a counter 3 (FIG. 1). When an external resistance RZQ and an internal pull-up resistance RUP become equal to each other by the pull-up calibration operation, a current IUP and a current IDN become equal to each other at a ZQ node and the potential of the ZQ node becomes ½ VDDQ.

Figure 3:
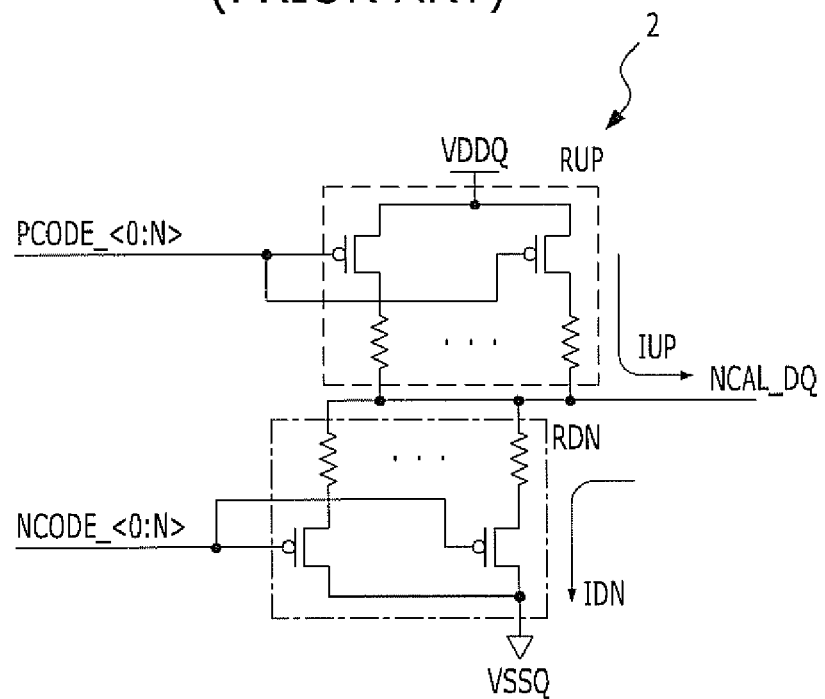
FIG. 3 is a diagram illustrating a conventional pull-down calibration control process.

As illustrated in FIG. 3, a pull-down calibration operation is performed using a PCODE<0:N>signal generated by a counter 3 and a NCODE<0:N> signal generated by a counter 5. The pull-down calibration operation equalizes a pull-down resistance RDN and a pull-up resistance RUP calibrated by the pull-up calibration operation. Here, when the pull-up resistance RUP and the pull-down resistance RDN become equal to each other, a current IUP and a current IDN become equal to each other at a NCAL_DQ node and the potential of the NCAL_DQ node also becomes ½ VDDQ.

Figure 4:
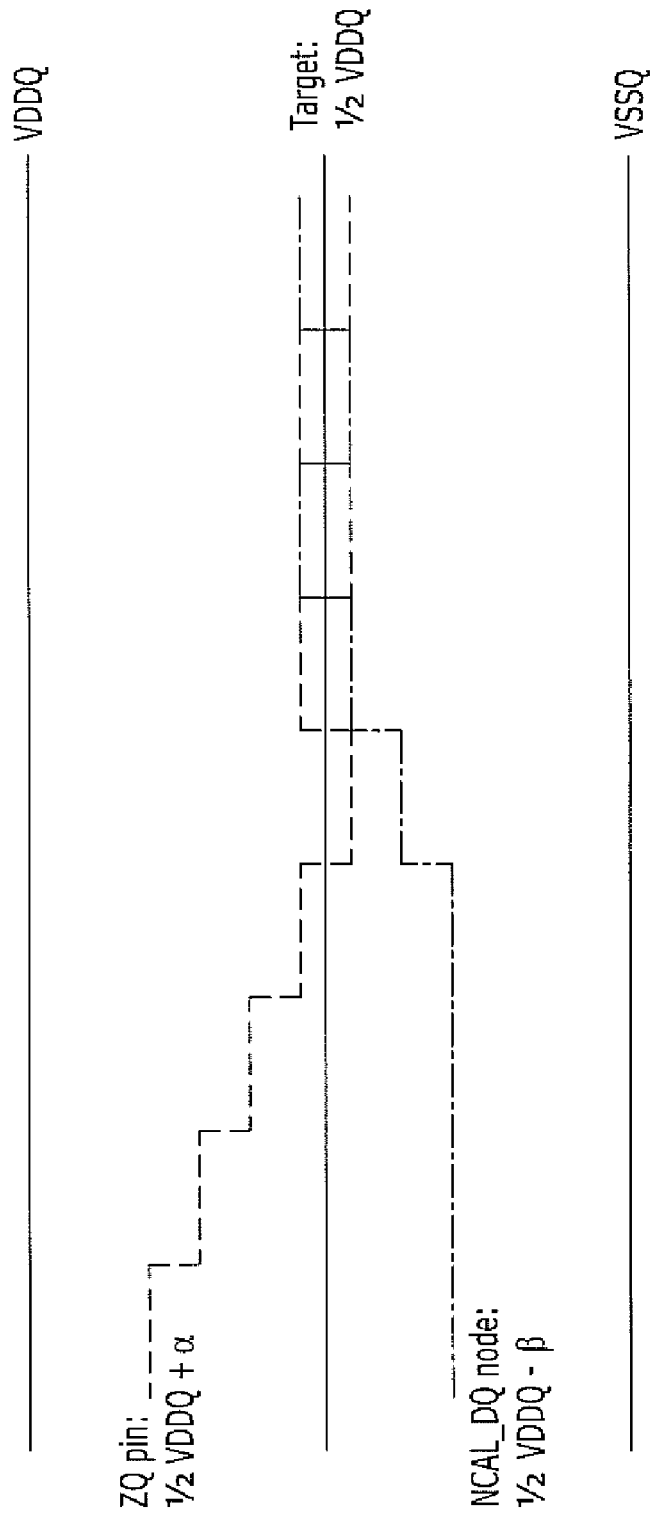
FIG. 4 is a diagram illustrating a target potential tracking process according to a ZQ calibration control process.
Figure 7:
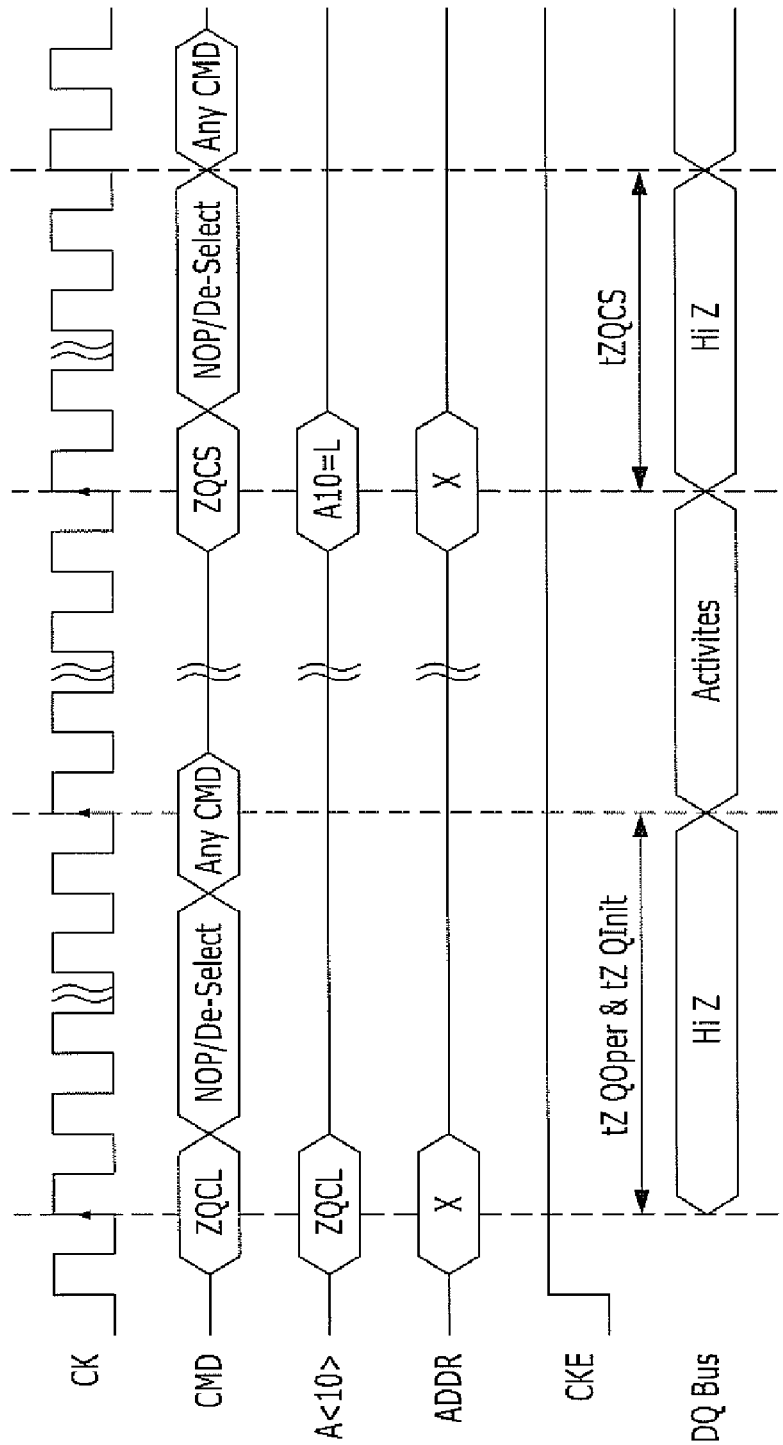
FIG. 7 is a timing diagram illustrating a conventional ZQCL operation mode and a conventional ZQCS operation mode.
Figure 8:
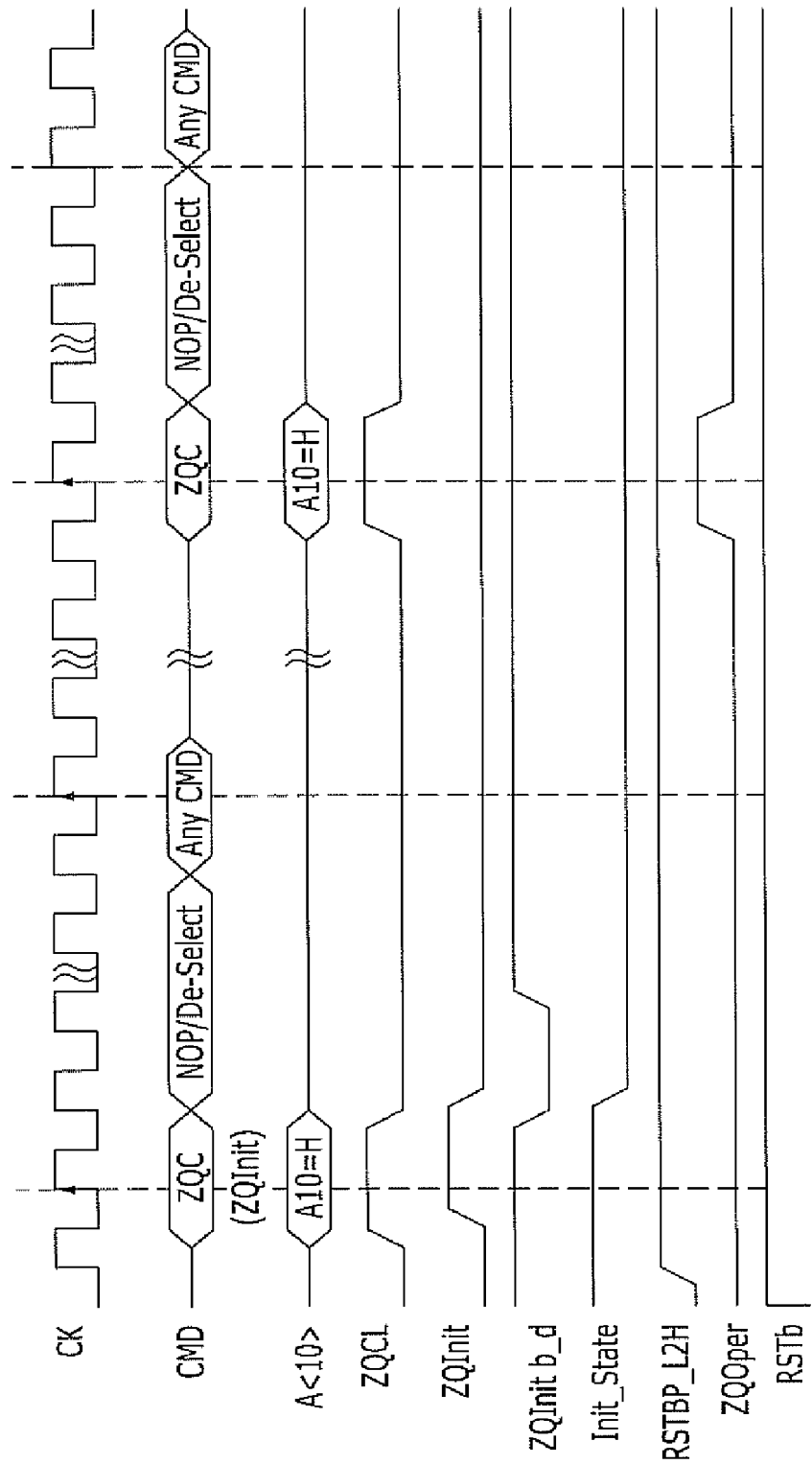
FIG. 8 is a timing diagram illustrating a conventional ZQCL operation mode.

In this manner, the potential of the ZQ node and the potential of the NCAL_DQ node are controlled to be at the target value ½ VDDQ by the pull-up calibration operation control and the pull-down calibration operation control as illustrated in FIG. 4.

The control circuit illustrated in FIG. 9 is used to generate control signals for the above-described ZQ calibration modes.

More specifically, the impedance calibration mode control circuit in accordance with the present invention includes a ZQCS mode signal generating unit for controlling a calibration operation together with a refresh operation. The ZQCS mode signal generating unit includes a timing tuning unit 30 receiving an address A<10> signal and adjust a delay of a signal by selectively turning on/off different switches in the timing tuning unit to selectively connect one or more of delays formed by inverters; and a NAND gate 32 receiving a refresh command signal IREF and the signal of the timing tuning unit 30 to generate a ZQCS mode signal.

Also, the impedance calibration mode control circuit according to an exemplary embodiment of the present invention includes a ZQCL mode signal generating unit for controlling a calibration operation according to a calibration command signal ZQC. The ZQCL mode signal generating unit includes inverters 37 and 38 for successively inverting the signal of the timing tuning unit 30; and a NAND gate 31 receiving a ZQ calibration command signal ZQC and an output of the inverters to generate a ZQCL mode signal.

Meanwhile, the ZQCL mode signal is used to generate a ZQINIT mode signal and a ZQOPER mode signal that control the calibration operation in different modes, respectively. A ZQINIT mode signal generating unit includes a latch unit including two NAND gates 33 and 34 for latching a reset signal RST; and a signal generating unit including a NAND gate 35 and an inverter 39, where the NAND gate 35 receives the ZQCL mode signal and a state signal INIT_STATE from the latch unit (33 and 34), to generate a ZQINIT signal for controlling a ZQ calibration operation performed immediately after a power-up operation.

A ZQOPER mode signal generating unit includes an inverter 41 inverting an output of the latch unit; and a NAND gate 36 and an inverter 40 receiving an output of a delay unit 50, which is generated by delaying an output signal of the inverter 41, the ZQCL mode signal, and the ZQINIT signal generated by the signal generating unit by a desired period of time, to generate a ZQOPER signal for controlling a ZQ calibration operation.

Hereinafter, an operation of an impedance calibration mode control circuit having the above-described configuration in accordance with an exemplary embodiment of the present invention will be described in detail with reference to the accompanying drawings.

First, a ZQCL mode signal generating process in accordance with an exemplary embodiment of the present invention will be described in detail with reference to FIG. 10.

Figure 10:
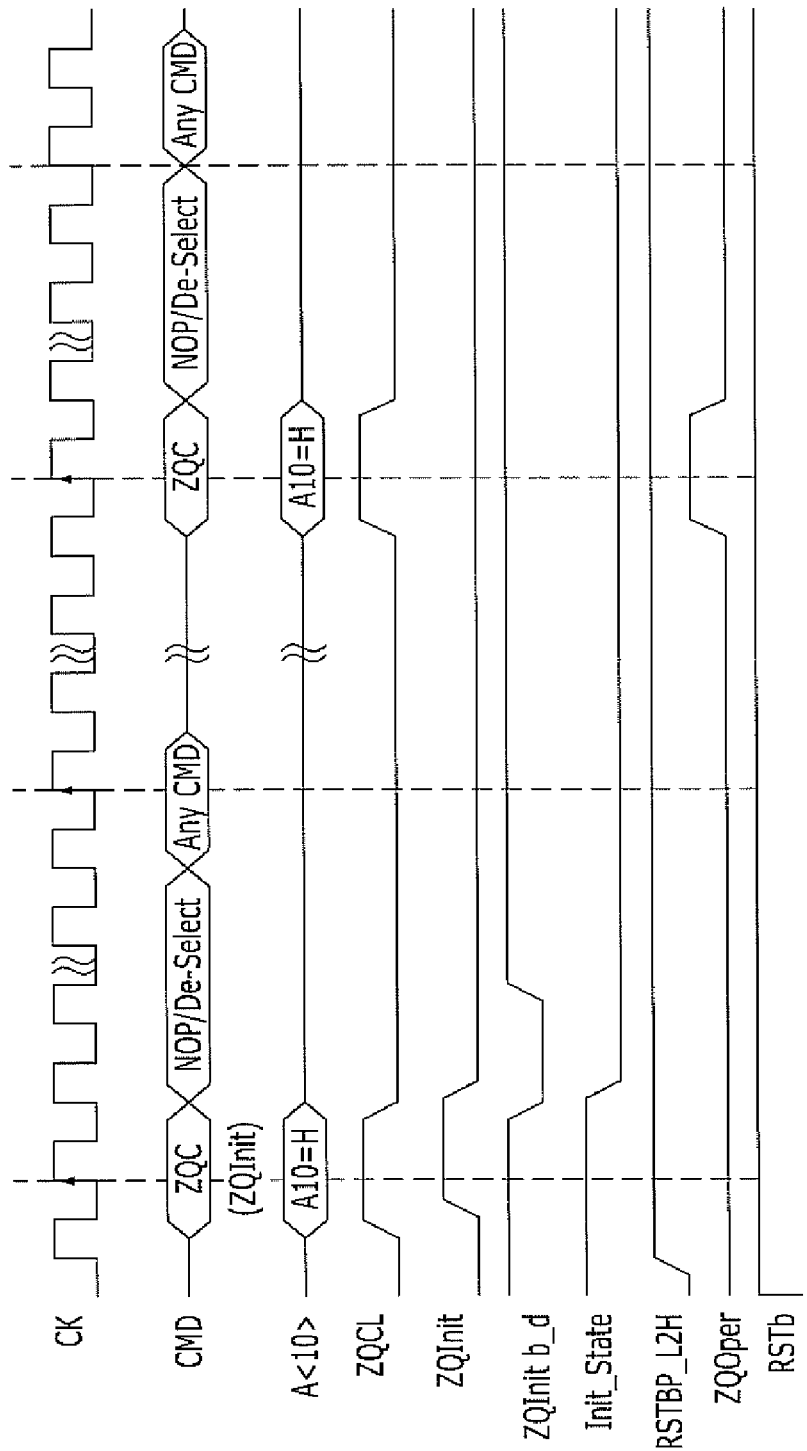
FIG. 10 is a timing diagram illustrating a ZQCL operation mode in accordance with an exemplary embodiment of the present invention.

FIG. 10 is a timing diagram illustrating a ZQCL operation mode for generating a ZQCL mode signal in accordance with an exemplary embodiment of the present invention.

An address signal A<10> of a high logic level '1' outputted through the timing tuning unit 30 is received by the NAND gate 31 through the inverters 37 and 38. Also, a ZQ command ZQC is inputted to a second input terminal of the NAND gate 31. Herein, a signal generated by the NAND gate 31 is a ZQCL mode signal. The ZQCL mode signal generated by the NAND gate 31 is received as an input signal of the NAND gates 35 and 36 of the signal generating unit.

Meanwhile, when a power-up operation is performed and a ZQ command is inputted first, the latch unit (33 and 34) latching a reset signal RST (RSTb and RSTbp_L2H) generates a state signal INIT_STATE of a high (1) level. Also, the NAND gate 35 receives the ZQCL mode signal and the state signal INIT_STATE to generate a pulse signal for a ZQINIT mode signal. The ZQ calibration operation illustrated in FIG. 1 is controlled in response to the ZQINIT mode signal.

After the ZQINIT mode signal is generated, an address signal A<10> of a high logic level '1' outputted from the timing tuning unit 30 is inputted to the NAND gate 31 through the inverters 37 and 38. Also, a ZQ command ZQC is inputted to a second input terminal of the NAND gate 31. Here, a signal generated by the NAND gate 31 is a ZQCL mode signal. The ZQCL mode signal generated by the NAND gate 31 is transferred as an input signal of the NAND gates 35 and 36 of the signal generating unit.

When the ZQINIT mode signal is delayed by the delay unit 50 and is inputted to the NAND gate 36, the NAND gate 36 receives the ZQCL mode signal and the ZQINIT delay signal (ZQInit b_d) to generate a pulse signal for a ZQOPER mode signal. Thus, a calibration control operation is performed in response the ZQOPER mode signal.

More specifically, a ZQCL mode operation signal used in generating the ZQINIT mode operation signal and the ZQOPER mode operation signal is controlled by a ZQ command (ZQC) operation signal, a reset signal RST, and an address signal A<10>.

Next, a ZQCS mode signal generating process in accordance with an exemplary embodiment of the present invention will be described in detail with reference to FIG. 11.

Figure 11:
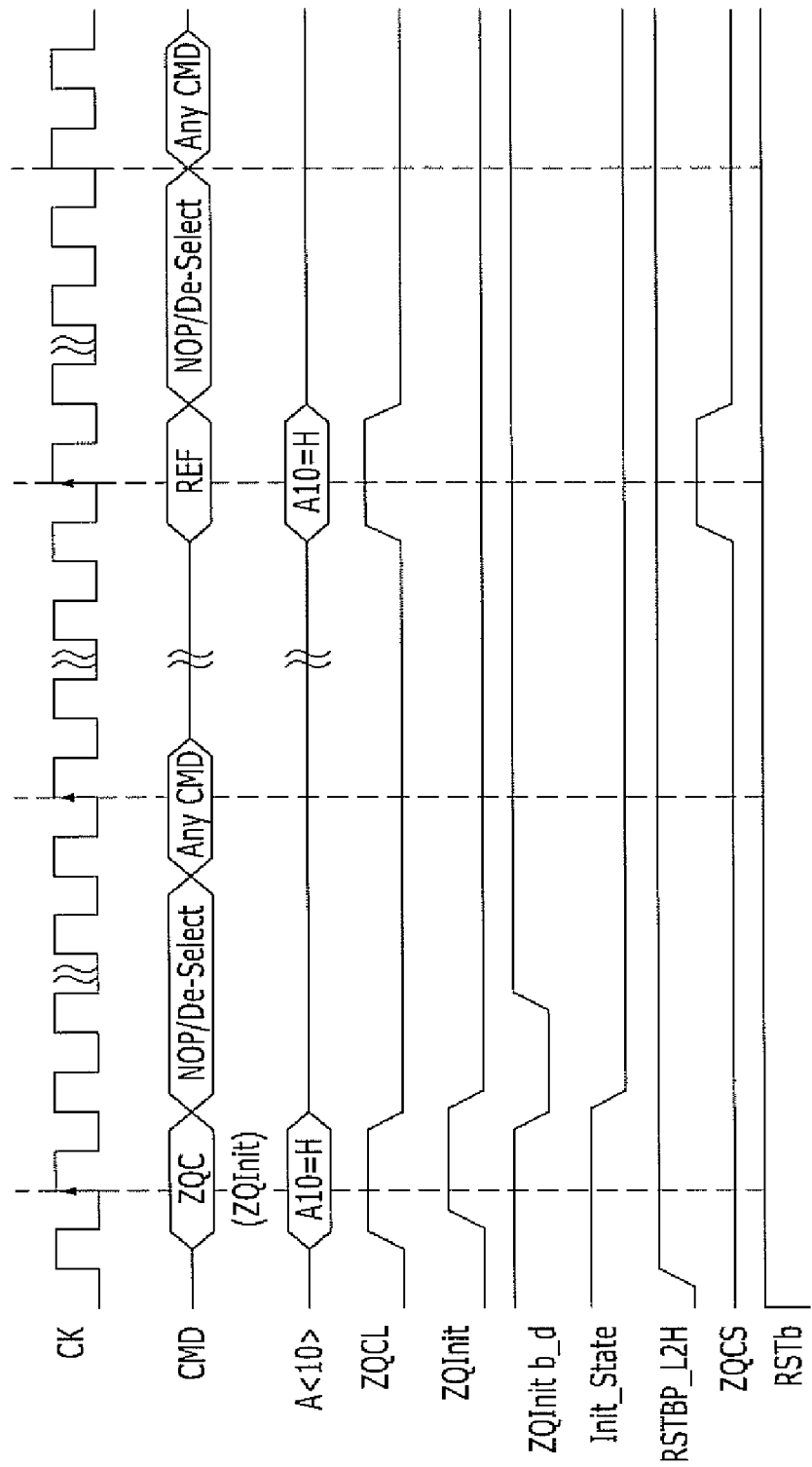
FIG. 11 is a timing diagram illustrating a ZQCS operation mode in accordance with an exemplary embodiment of the present invention.

FIG. 11 is a timing diagram illustrating a ZQCS operation mode for generating a ZQCS mode signal in accordance with an exemplary embodiment of the present invention.

When a refresh command (IREF) signal is inputted, the NAND gate 32 generates a ZQCS mode operation signal in response to an address signal A<10> of a high logic level '1' outputted from the timing tuning unit 30. Here, during a refresh operation, the present invention generates a ZQCS mode signal to perform a calibration operation according to a ZQCS mode and also the address signal A<10> of a high logic level '1', where the address signal A<10> of a high logic level '1' is generated for entering a ZQCS mode during a refresh operation.

According to an exemplary embodiment of the invention, while during the performance of the refresh operation, other operations are not normally performed, a ZQCS operation is performed simultaneously with the refresh operation. By simultaneously performing the operations, time for the operations may be reduced.

Meanwhile, because a ZQCS mode operation is not constantly being performed throughout a refresh operation, an address signal A<10> is used to control the ZQCS mode operation. More specifically, a ZQCS operation mode signal is generated when the refresh command signal (IREF) and the address signal A<10> of a high logic level '1' as outputted from the timing tuning unit 30 are received by the NAND gate 32.

The aforesaid exemplary embodiments of the present invention are disclosed for exemplary purposes. By controlling the ZQCS operation mode performed in the refresh operation, an exemplary embodiment of the present invention reduces a system dead time that may occur in performing an independent ZQCS mode.

As described above, an exemplary embodiment of the present invention simultaneously performs the ZQCS operation while the refresh operation is being performed.

While the present invention has been described with respect to the specific embodiments, it will be apparent to those skilled in the art that various changes and modifications may be made without departing from the spirit and scope of the invention as defined in the following claims.

What is claimed is:

1. An impedance calibration mode control circuit comprising:
    a first signal generating unit configured to generate a first calibration control signal in response to a ZQ calibration command received after a power-up operation; and
    a second signal generating unit configured to generate a second calibration control signal during a refresh operation of a semiconductor device.

2. The impedance calibration mode control circuit of claim 1, wherein the second signal generating unit generates the second calibration control signal in response to an address signal.

3. The impedance calibration mode control circuit of claim 2, wherein the second signal generating unit comprises an operation unit configured to generate a pulse signal as the second calibration control signal in response to a refresh command and the address signal.

4. The impedance calibration mode control circuit of claim 3, wherein the second signal generating unit further comprises a timing tuning unit configured to adjust a delay of the address signal.

5. The impedance calibration mode control circuit of claim 1, wherein the first signal generating unit comprises an operation unit configured to receive the ZQ calibration command and an address signal and generate the first calibration control signal, 6. The impedance calibration mode control circuit of claim 5, wherein the first signal generating unit further comprises a timing tuning unit configured to adjust a delay of the address signal.

7. The impedance calibration mode control circuit of claim 6, wherein the first signal generating unit further comprises an inverter configured to invert an output signal of the timing tuning unit.

8. The impedance calibration mode control circuit of claim 5, wherein the first signal generating unit further comprises a first pulse generating unit configured to receive the first calibration control signal from the operation unit and a state signal generated after a power-up operation and generate a pulse signal as a third calibration control signal.

9. The impedance calibration mode control circuit of claim 8, wherein the first pulse generating unit comprises:
    a NAND gate configured to receive the state signal and the first calibration control signal; and an inverter configured to invert an output of the NAND gate.

10. The impedance calibration mode control circuit of claim 8, wherein the first signal generating unit further comprises:
a delay unit configured to delay the third calibration control signal; and
a second pulse generating unit configured to receive a delay signal of the delay unit, the state signal, and the first calibration control signal and generate a pulse signal as a fourth calibration mode signal.

11. The impedance calibration mode control circuit of claim 8, wherein the state signal is an output signal of the latch unit that latches a reset signal generated after a power-up operation.

12. The impedance calibration mode control circuit of claim 10, wherein the state signal inputted to the second pulse generating unit is an inverted signal of the state signal inputted to the first pulse generating unit.

13. The impedance calibration mode control circuit of claim 1, wherein during the refresh operation, an operation corresponding to the second calibration control signal is performed.

14. The impedance calibration mode control circuit of claim 1, wherein the second signal generating unit generates a pulse as the second calibration control signal in response to an address signal generated during the refresh operation.

15. An impedance calibration mode control circuit comprising:
a first signal generating unit configured to generate a first calibration control signal in response to a first ZQ calibration command received after a power-up operation;
a second signal generating unit configured to generate a second calibration control signal during a refresh operation of a semiconductor device; and
a third signal generating unit configured to receive a second command and the first calibration control signal as delayed for a first period of time and generate a third calibration control signal.

16. The impedance calibration mode control circuit of claim 15, wherein the second signal generating unit generates the second calibration control signal in response to an address signal and a refresh operation signal.

17. The impedance calibration mode control circuit of claim 16, wherein the second signal generating unit comprises an operation unit configured to generate a pulse signal as the second calibration control signal in response to a refresh command and the address signal.

18. An impedance calibration mode control circuit comprising:
a first signal generating unit configured to generate a first calibration control signal in response to a ZQ calibration command;
a second signal generating unit configured to generate a second calibration control signal during a refresh operation of a semiconductor device;
a third signal generating unit configured to receive the first calibration control signal in response to a second command received after a power-up operation and generate a third calibration control signal; and
a fourth signal generating unit configured to receive the first calibration control signal and the third calibration control signal as delayed by a first period of time and generate a fourth calibration control signal.

19. The impedance calibration mode control circuit of claim 18, wherein the second signal generating unit is configured to generate the second calibration control signal in response to an address signal and a refresh operation signal.

20. The impedance calibration mode control circuit of claim 19, wherein the second signal generating unit comprises an operation unit configured to generate a pulse signal as the second calibration control signal in response to a refresh command and the address signal.

* * * * *